(12) United States Patent
Ryu et al.

(10) Patent No.: US 8,795,931 B2
(45) Date of Patent: Aug. 5, 2014

(54) REFLECTION-TYPE PHOTOMASKS AND METHODS OF FABRICATING THE SAME

(71) Applicant: SK hynix Inc., Icheon-si (KR)

(72) Inventors: Choong Han Ryu, Seoul (KR); Yong Dae Kim, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/754,187

(22) Filed: Jan. 30, 2013

(65) Prior Publication Data

US 2013/0196256 A1    Aug. 1, 2013

(30) Foreign Application Priority Data

Jan. 30, 2012   (KR) ................. 10-2012-0009198
Dec. 20, 2012   (KR) ................. 10-2012-0150090

(51) Int. Cl.
*G03F 1/22* (2012.01)
*G03F 1/24* (2012.01)

(52) U.S. Cl.
USPC .............................................. 430/5

(58) Field of Classification Search
CPC ..................................... G03F 1/22; G03F 1/24
USPC .................... 430/5, 322, 323, 394; 378/35
See application file for complete search history.

(56) References Cited

U.S. PATENT DOCUMENTS

| | | | |
|---|---|---|---|
| 7,060,401 B1 | 6/2006 | LaFontaine et al. | |
| 7,282,307 B2 | 10/2007 | Hector et al. | |
| 7,601,467 B2 | 10/2009 | Huh et al. | |
| 7,960,076 B2 | 6/2011 | Kamo et al. | |
| 2003/0039894 A1* | 2/2003 | Yan et al. ........................ | 430/5 |
| 2004/0131947 A1 | 7/2004 | Fisch Gallagher et al. | |
| 2011/0151358 A1 | 6/2011 | Kamo | |

FOREIGN PATENT DOCUMENTS

KR       100945933 B1     2/2010
KR    1020100137194 A    12/2010

* cited by examiner

*Primary Examiner* — Stephen Rosasco
(74) *Attorney, Agent, or Firm* — William Park & Associates Patent Ltd.

(57) ABSTRACT

Reflection-type photomasks are provided. The reflection-type photomask includes a substrate and a reflection layer on a front surface of the substrate. The substrate includes a pattern transfer region, a light blocking region and a border region. A trench penetrates the reflection layer in the border region to expose the substrate. First absorption layer patterns are disposed on the reflection layer in the pattern transfer region, and a second absorption layer pattern is disposed on the reflection layer in the light blocking region. Sidewalls of the trench have a sloped profile. Related methods are also provided.

24 Claims, 8 Drawing Sheets

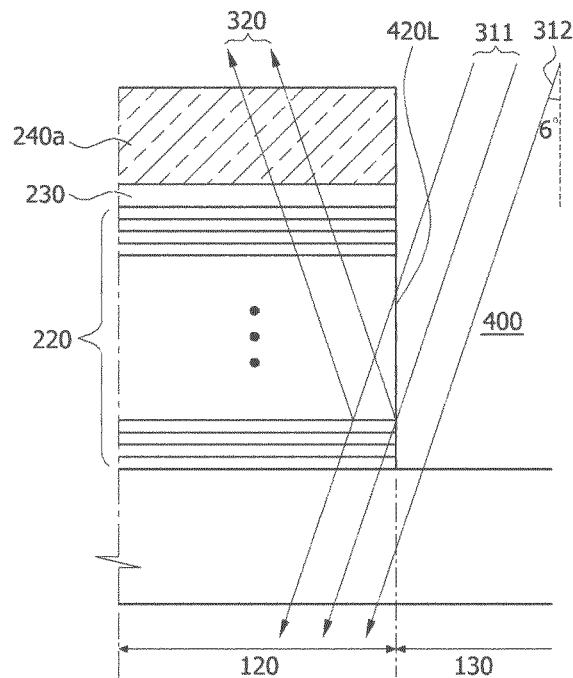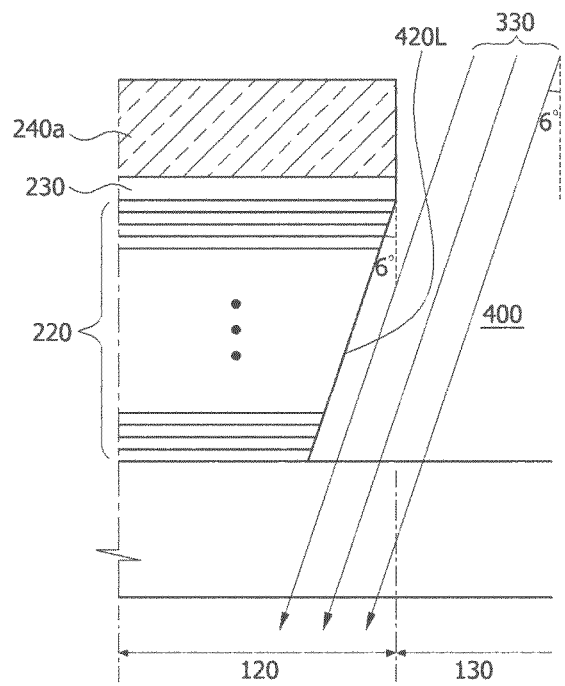

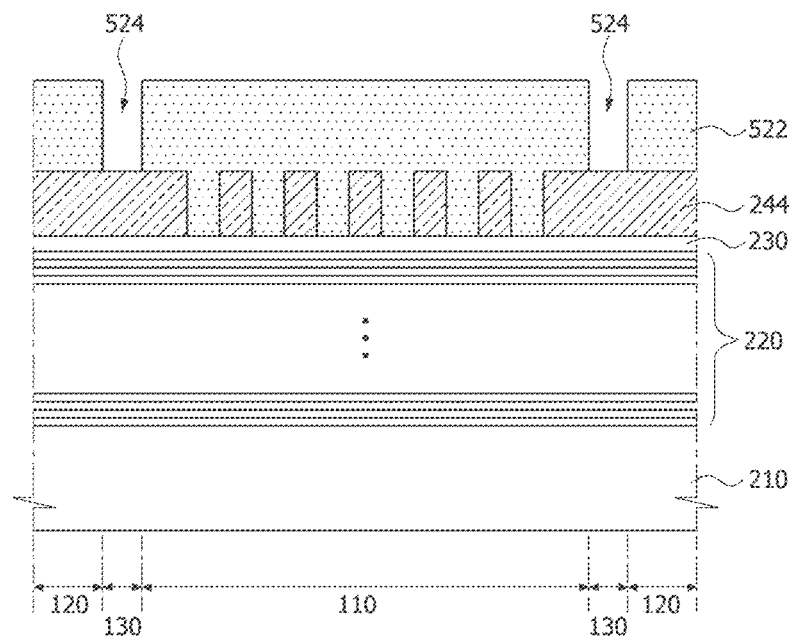
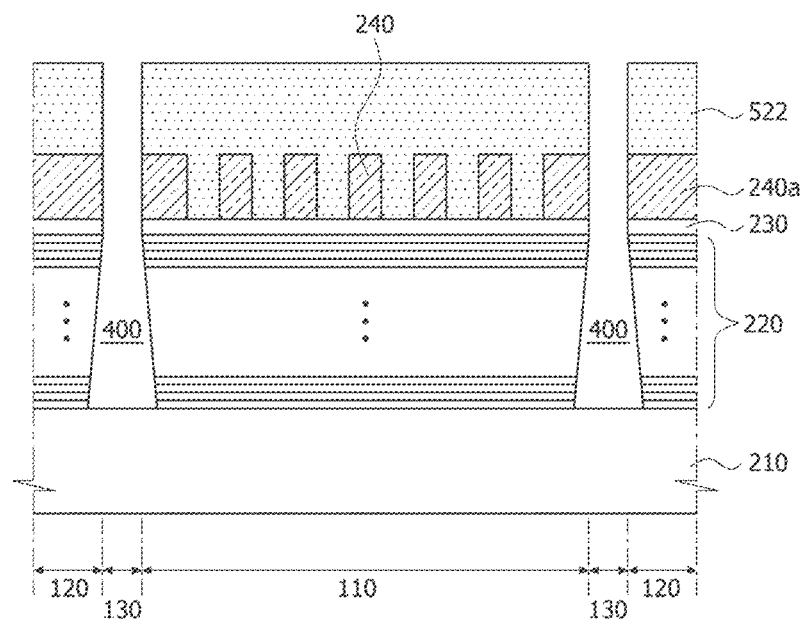

REFLECTION-TYPE PHOTOMASKS AND METHODS OF FABRICATING THE SAME

CROSS-REFERENCES TO RELATED APPLICATIONS

The present application claims priority under 35 U.S.C 119(a) to Korean Application Nos. 10-2012-0009198 and 10-2012-0150090, filed on Jan. 30, 2012 and Dec. 20, 2012, respectively, in the Korean intellectual property Office, which are incorporated herein by references in their entirety as set forth in full.

BACKGROUND

1. Technical Field

Embodiments of the present disclosure generally relate to photomasks used in fabrication of semiconductor devices and methods of fabricating the photomasks and, more particularly, to reflection-type photomasks used in fabrication of semiconductor devices and methods of fabricating the reflection-type photomasks.

2. Related Art

Integration density of semiconductor devices has been continuously increased with the development of a nano-technology. As the semiconductor devices become more highly integrated, some elements such as transistors and interconnection lines have been scaled down to reduce sizes thereof. Next-generation semiconductor technologies may depend on process technologies, which provide the possibility of formation of fine patterns, rather than circuit design technologies. The formation of the fine patterns may be closely related with photolithography process technologies. The photolithography process may include forming a photoresist layer on a semiconductor substrate, transferring desired pattern images onto the photoresist layer using a light to selectively expose portions of the photoresist layer, and developing the exposed photoresist layer with a developer to form photoresist patterns. The light used in the exposure step may directly affect a resolution of the photoresist patterns.

The resolution of the photoresist patterns may depend on a wavelength of the light used in the exposure step of the photolithography process. Various lights may be used in the exposure step of the photolithography process. For example, the light used in the exposure step of the photolithography process may be one of an i-line beam having a wavelength of about 365 nanometers, a KrF laser beam having a wavelength of about 248 nanometers and an ArF laser beam having a wavelength of about 193 nanometers. Even though the lights having short wavelengths such as the i-line beam, the KrF laser beam and the ArF laser beam are used in the exposure step of the photolithography process, there may be still limitations in enhancing the pattern resolutions of the highly integrated semiconductor devices. Thus, in recent years, extreme ultraviolet (EUV) rays referred to as soft X-rays have been revealed to overcome the limitations of the photolithography processes utilizing the i-line beam, the KrF laser beam or the ArF laser beam as a light source.

The EUV ray has a wavelength of about 13.5 nanometers which is considerably less than those of the i-line beam, the KrF laser beam or the ArF laser beam. Since the wavelength of the light used in the exposure step directly affect the pattern resolution, the EUV lithography process utilizing the EUV ray as a light source may exhibit a remarkably high pattern resolution as compared with the photolithography process utilizing the i-line beam, the KrF laser beam or the ArF laser beam as a light source. However, the EUV ray may have high energy because the wavelength of the EUV ray is too short. Thus, it may be difficult to use the typical transmission-type photomasks as the photomasks of the EUV lithography process. This is because transparent substrates of the typical transmission-type photomasks are too weak to endure the high energy of the EUV ray and the energy efficiency of the EUV ray is too low to enhance the pattern resolution. Accordingly, reflection-type photomasks have been proposed to overcome the disadvantages of the typical transmission-type photomasks. When the reflection-type photomasks are used in the EUV lithography process, the EUV ray may be reflected on surfaces of the reflection-type photomasks without penetrating the reflection-type photomasks. Hence, the high energy of the EUV ray may not be applied to the substrates of the reflection-type photomasks.

SUMMARY

Various embodiments are directed to reflection-type photomasks used in fabrication of semiconductor devices and methods of fabricating the reflection-type photomasks.

According to various embodiments, a reflection-type photomask includes a substrate and a reflection layer on a front surface of the substrate. The substrate includes a pattern transfer region, a light blocking region and a border region. A trench penetrates the reflection layer in the border region to expose the substrate. First absorption layer patterns are disposed on the reflection layer in the pattern transfer region, and a second absorption layer pattern is disposed on the reflection layer in the light blocking region. Sidewalls of the trench have a sloped profile.

In various embodiments, the substrate may be a low thermal expansion material (LTEM) substrate.

In various embodiments, the reflection layer may have a multi-layered structure including a first reflection layer and a second reflection layer which are alternately and repeatedly stacked, and the first reflection layer and the second reflection layer may have different diffraction coefficients from each other.

In various embodiments, one of the first and second reflection layers may be a molybdenum (Mo) layer and the other may be a silicon (Si) layer.

In various embodiments, an uppermost layer of the reflection layer having the multi-layered structure may be a molybdenum (Mo) layer.

In various embodiments, the reflection-type photomask may further include a capping layer between the reflection layer and the first and second absorption layer patterns.

In various embodiments, each of the first and second absorption layer patterns may include an aluminum copper (AlCu) layer, a titanium (Ti) layer, a titanium nitride (TiN) layer, a tantalum (Ta) layer, a tantalum nitride (TaN) layer or a chrome (Cr) layer.

In various embodiments, the pattern transfer region may be surrounded by the light blocking region, and the border region may be disposed between the pattern transfer region and the light blocking region.

In various embodiments, the sidewalls of the trench may have a slope which is parallel with incident EUV rays irradiated onto the substrate during an exposure process.

In various embodiments, the sidewalls of the trench may have a negative profile such that a width of the trench is gradually increased toward the substrate.

According to further embodiments, a reflection-type photomask includes a substrate and a reflection layer on a front surface of the substrate. The substrate includes a pattern transfer region having image patterns corresponding to patterns which are formed on a wafer, a light blocking region surrounding the pattern transfer region, and a border region between the pattern transfer region and the light blocking region. A trench penetrate the reflection layer in the border region to separate the reflection layer into two portions. Absorption layer patterns are disposed on the reflection layer. At least one of both sidewalls of the trench has a sloped profile.

According to further embodiments, a method of fabricating a reflection-type photomask includes forming a reflection layer and an absorption layer on a substrate. The substrate includes a pattern transfer region having image patterns corresponding to patterns which are formed on a wafer, a light blocking region surrounding the pattern transfer region, and a border region between the pattern transfer region and the light blocking region. Portions of the absorption layer in the pattern transfer region are removed to form absorption layer patterns. The absorption layer and the reflection layer in the border region are removed to form a trench exposing the substrate in the border region. At least one of both sidewalls of the reflection layer exposed by the trench is formed to have a negative sloped profile.

In various embodiments, the substrate may be formed of a low thermal expansion material (LTEM).

In various embodiments, the reflection layer may be formed by alternately and repeatedly stacking a first reflection layer and a second reflection layer that have different diffraction coefficients from each other.

In various embodiments, one of the first and second reflection layers may be formed of a molybdenum (Mo) layer and the other may be formed of a silicon (Si) layer.

In various embodiments, the method may further include forming a capping layer on the reflection layer prior to formation of the absorption layer.

In various embodiments, the absorption layer may be formed of an aluminum copper (AlCu) layer, a titanium (Ti) layer, a titanium nitride (TiN) layer, a tantalum (Ta) layer, a tantalum nitride (TaN) layer or a chrome (Cr) layer.

In various embodiments, the sidewalls of the trench are formed to be parallel with incident EUV rays irradiated onto the substrate during an exposure process.

In various embodiments, the trench may be formed by etching the absorption layer and the reflection layer using a dry etch process that employs a chlorine ($Cl_2$) gas as an etch gas.

In various embodiments, the absorption layer patterns may be formed by dry-etching the absorption layer using a first resist pattern as an etch mask, and the trench may be formed by dry-etching the absorption layer and the reflection layer using a second resist pattern as an etch mask.

In various embodiments, the trench may be formed using a plasma etching apparatus.

In various embodiments, the trench may be formed by alternately and repeatedly applying a first etch process and a second etch process to the reflection layer. In such a case, the first etch process may be an etch process that a physical etch step is dominantly carried out and the second etch process may be an etch process that a chemical etch step is dominantly carried out.

In various embodiments, the first etch process may be performed using an argon gas as an main etch gas and the second etch process may be performed using a chlorine gas as an main etch gas.

In various embodiments, the trench may be formed by alternately and repeatedly applying a first etch process and a second etch process to the reflection layer. In such a case, the first etch process may be performed with a relatively high bias power and the second etch process may be performed with a relatively low bias power.

BRIEF DESCRIPTION OF THE DRAWINGS

Embodiments of the inventive concept will become more apparent in view of the attached drawings and accompanying detailed description, in which:

FIGS. 3, 4 and 5 are cross sectional views illustrating reflection suppress mechanisms of EUV rays in a border region of a reflection-type photomask according to various embodiments;

FIGS. 6 to 10 are cross sectional views illustrating a method of fabricating a reflection-type photomask according to various embodiments;

DETAILED DESCRIPTION

Figure 1:
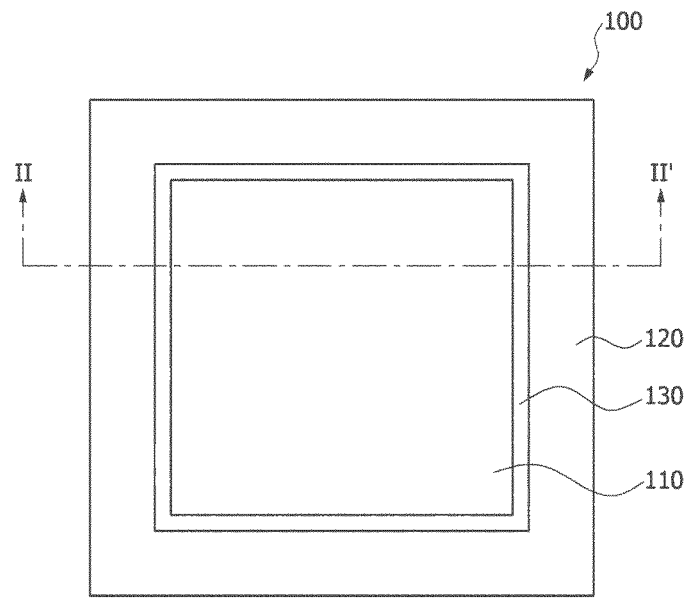
FIG. 1 is a plan view illustrating a reflection-type photomask according to various embodiments.
Figure 2:
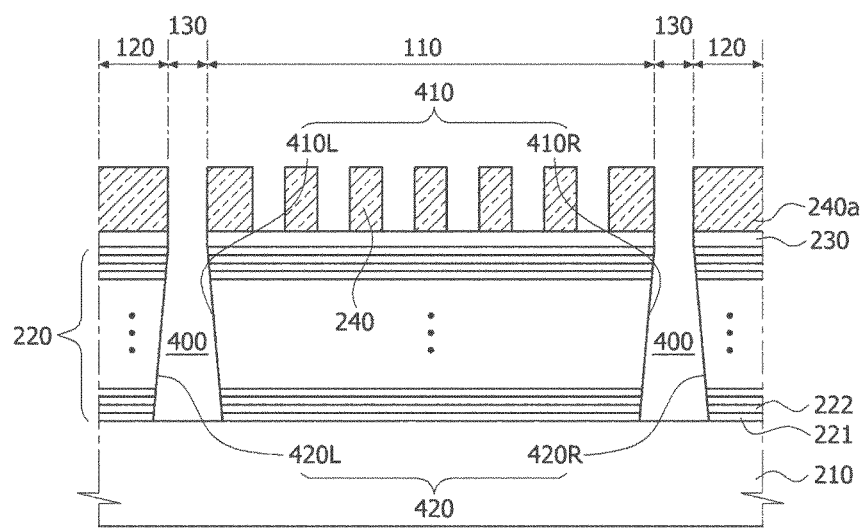
FIG. 2 is a cross sectional view taken along a line II-II' of FIG. 1.

FIG. 1 is a plan view illustrating a reflection-type photomask according to various embodiments, and FIG. 2 is a cross sectional view taken along a line II-II' of FIG. 1. Referring to FIGS. 1 and 2, a reflection-type photomask 100 according to an embodiment may include a pattern transfer region 110 having image patterns corresponding to patterns which may be formed on a wafer, a light blocking region 120 surrounding the pattern transfer region 110, and a border region 130 disposed between the pattern transfer region 110 and the light blocking region 120. The pattern transfer region 110 may be configured to include a substrate 210, a reflection layer 220 disposed on a surface of the substrate 210, a capping layer 230 disposed on a surface of the reflection layer 220 opposite to the substrate 210, and first absorption layer patterns 240 disposed on a surface of the capping layer 230 opposite to the reflection layer 220 to expose portions of the capping layer 230. The light blocking region 120 may absorb an EUV ray incident onto the substrate 210 to suppress or prevent the EUV ray from being reflected or scattered onto neighbor shot fields adjacent to a target shot field during an exposure step for selectively exposing only the target shot filed using the reflection-type photomask 100. The light blocking region 120 may include the substrate 210, the reflection layer 220 disposed on the substrate 210, the capping layer 230 disposed on the reflection layer 220 opposite to the substrate 210, and a second absorption layer pattern 240a disposed on the capping layer 230 opposite to the reflection layer 220 to cover an entire surface of the capping layer 230 in the light blocking region 120. In various embodiments, the capping layer 230 may be absent. In such a case, the first absorption layer patterns 240 in the pattern transfer region 110 may expose portions of the reflection layer 220. The border region 130 between the pattern transfer region 110 and the light blocking region 120 may include the substrate 210 and a trench 400 that penetrates the first absorption layer patterns 240 (or the second absorption layer pattern 240a), the capping layer 230 and the reflection layer 220 to expose the substrate 210. Sidewalls 410 and 420 of the trench 400 may have sloped profiles. Further detailed descriptions to the sloped profiles of the sidewalls 410 and 420 of the trench 400 will be developed later.

The substrate 210 may be a low thermal expansion material (LTEM) substrate. If the EUV ray is absorbed into a certain material, the high energy of the EUV ray may be transformed into a thermal energy to increase a temperature of the certain material and to expand a volume of the certain material. Thus, the substrate 210 may include a material having a low thermal expansion coefficient to suppress increase of the temperature of the substrate 210 even though the EUV ray is absorbed into the substrate 210. In various embodiments, the substrate 210 may include a material having a thermal expansion coefficient that corresponds to a pattern disposition error rate of about ±0.05 ppm/° C. within a temperature range of 0° C. to 50° C. Further, it may be necessary for the substrate 210 to have an excellent flatness. For example, the substrate 210 may have a front surface flatness of about 50 nanometers or less and a backside surface flatness of about 500 nanometers or less. In addition, an EUV ray reflectivity of the substrate 210 may be substantially zero to prevent the EUV ray from being reflected on the substrate 210 in the border region 130.

The reflection layer 220 may have a multi-layered structure including a first reflection layer 221 and a second reflection layer 222 which are alternately and repeatedly stacked, and the first reflection layer 221 and the second reflection layer 222 may have different diffraction coefficients from each other. The first and second reflection layers 221 and 222 may be alternately stacked at least twice to constitute the reflection layer 220. As a result, the reflection layer 220 may include a plurality of first reflection layers 221 and a plurality of second reflection layers 222 between the plurality of first reflection layers 221. In various embodiments, one of the first reflection layer 221 and the second reflection layer 222 may be a molybdenum (Mo) layer and the other layer may be a silicon (Si) layer. In such a case, an uppermost layer of the reflection layer 220 may be a molybdenum (Mo) layer. In various embodiments, the molybdenum (Mo) layer may be replaced with a ruthenium (Ru) layer. A thickness of the molybdenum (Mo) layer and a thickness of the silicon (Si) layer may be optimized to minimize the absorption of the EUV ray and to maximize the dispersion of the EUV ray. In various embodiments, the molybdenum (Mo) layer may have a thickness of about 2.8 nanometers and the silicon (Si) layer may have a thickness of about 4.1 nanometers. The number of the molybdenum (Mo)-silicon (Si) pairs constituting the reflection layer 220 may be within the range of about 30 to about 60 pairs. In various embodiments, the number of the molybdenum (Mo)-silicon (Si) pairs constituting the reflection layer 220 may be within the range of about 40 to about 60 pairs. This is because the EUV ray reflectivity of the reflection layer 220 is remarkably reduced if the number of the molybdenum (Mo)-silicon (Si) pairs constituting the reflection layer 220 is less than 40. If the number of the molybdenum (Mo)-silicon (Si) pairs constituting the reflection layer 220 is greater than 40 pairs, the EUV ray reflectivity of the reflection layer 220 may be dully increased. Additionally, if the number of the molybdenum (Mo)-silicon (Si) pairs constituting the reflection layer 220 is greater than 60 pairs, it may take a long time to deposit the reflection layer 220 and a defect density of the reflection layer 220 may be abruptly increased.

The capping layer 230 may act as a protection layer of the reflection layer 220. However, the capping layer 230 should protect the reflection layer 220 without degradation of the EUV ray reflectivity of the reflection layer 220. Thus, the capping layer 230 may be thinly formed of a material having a relatively low EUV ray absorptiveness. However, if the capping layer 230 is too thin, the capping layer 230 may not protect the reflection layer 220 during a photomask fabrication process (e.g., a mask printing process, a repair process or a cleaning process) and/or an exposure process using the reflection-type photomask 100. Thus, the capping layer 230 may have an appropriate thickness to act as the protection layer of the reflection layer 220 and to maintain a relatively low EUV ray absorptiveness. For example, the capping layer 230 may be formed to include a silicon (Si) layer or a ruthenium (Ru) layer and to have a thickness of about 1 nanometer to about 2.5 nanometers.

The absorption layer patterns 240 and 240a may include a metal layer having a property that absorbs the EUV ray when an exposure process is performed using the reflection-type photomask 100. Although not shown in the drawings, buffer layer patterns may be additionally disposed between the absorption layer patterns 240 and 240a and the capping layer 230, and anti-reflective coating (ARC) layer patterns may be additionally disposed on respective ones of the absorption layer patterns 240 and 240a. The buffer layer patterns may be disposed to protect the reflection layer 220 during an etch process and a repair process for forming the absorption layer patterns 240 and 240a, and the anti-reflective coating (ARC) layer patterns may be disposed to suppress a light reflection on the absorption layer patterns 240 and 240a when a pattern defect inspection process is performed using a deep ultraviolet (DUV) ray. The absorption layer patterns 240 and 240a may include a material having a relatively high EUV ray absorptiveness. For example, the absorption layer patterns 240 and 240a may include an aluminum copper (AlCu) layer, a titanium (Ti) layer, a titanium nitride (TiN) layer, a tantalum (Ta) layer, a tantalum nitride (TaN) layer or a chrome (Cr) layer. When the absorption layer patterns 240 and 240a are formed of a tantalum nitride (TaN) layer or a chrome (Cr) layer, the absorption layer patterns 240 and 240a may have a thickness of about 70 nanometers or greater to obtain an EUV ray reflectivity of about 1% or less.

As described above, the trench 400 exposing the substrate 210 may be disposed in the border region 130 between the pattern transfer region 110 and the light blocking region 120. The trench 400 may also expose sidewalls of the reflection layer 220 in the pattern transfer region 110 and the light blocking region 120. That is, sidewalls 410L and 410R of the reflection layer 220 in the pattern transfer region 110 and sidewalls 420L and 420R of the reflection layer 220 in the light blocking region 120 may correspond to sidewalls of the trench 400. Thus, the sidewalls 410L, 410R, 420L and 420R of the reflection layers 220 may be construed as the sidewalls of the trench 400 hereinafter. In various embodiments, the sidewalls 410L, 410R, 420L and 420R of the trench 400 may have a sloped profile. Specifically, the trench may include a first sidewall 410 and a second sidewall 420. The first sidewall 410 may include the inner sidewalls 410L and 410R exposing the reflection layer 220 in the pattern transfer region 110, and the second sidewall 420 may include the outer sidewalls 420L and 420R exposing the reflection layer 220 in the light blocking region 120. At least one of the first sidewall (410L+410R) and the second sidewall (420L+420R) may have a sloped profile which is parallel with an EUV ray irradiated onto the substrate 210 at an incident angle which is greater than 0 degree with respect to a normal line of the substrate 210. That is, a width of the trench 400 may gradually increase toward the substrate 210. Therefore, at least one of the first sidewall (410L+410R) and the second sidewall (420L+420R) may have a negative sidewall profile. For example, if the EUV ray is irradiated onto a front surface of the substrate 210 at an incident angle of about 6 degrees with respect to a vertical normal line of the substrate 210, each of the sidewalls 410L, 410R, 420L and 420R of the trench 400 may have a negative profile which is sloped at an angle of about 6 degrees with respect to the vertical normal line of the substrate 210.

Figure 5:
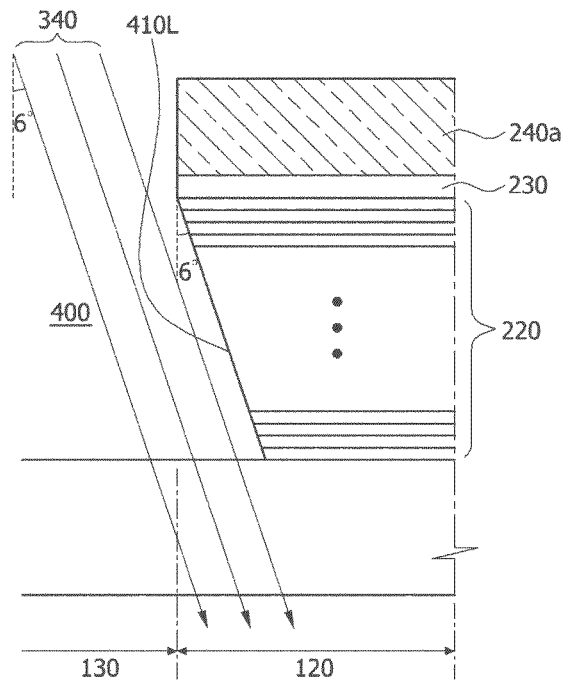

FIGS. 3, 4 and 5 are cross sectional views illustrating reflection suppress mechanisms of EUV rays in a border region of a reflection-type photomask according to various embodiments. FIG. 3 illustrates a vertical sidewall profile of a trench in a general reflection-type photomask, and FIGS. 4 and 5 illustrate negative sidewall profiles of trenches included in reflection-type photomasks according to various embodiments.

As illustrated in FIG. 3, if the second sidewall 420L of the trench 400 has a vertical profile, a portion of incident EUV rays 311 and 312 irradiated onto the border region 130 during an exposure process may be reflected in a bulk region of the reflection layer 220 in the light blocking region 120 and a portion of the reflected EUV rays may pass through the capping layer 230 and the second absorption layer pattern 240a in the light blocking region 120. Specifically, the incident EUV rays 311 and 312 may be irradiated onto the substrate 210 (see FIG. 2) at an incident angle of about 6 degrees with respect to a normal line of the substrate 210. Thus, the incident EUV ray 312 spaced apart from the sidewall 420L of the trench 400 may directly pass through the substrate 210 without penetrating the reflection layer 220. In contrast, the incident EUV rays 311 adjacent to the sidewall 420L of the trench 400 may penetrate the reflection layer 220 and a portion of the incident EUV rays 311 may be reflected in the reflection layer 220. A portion of the EUV rays 311 reflected in the reflection layer 220 may penetrate the second absorption layer pattern 240a to function as reflection rays 320 travelling toward a wafer. The reflection rays 320 may cause undesired exposure on the wafer to form pattern defects. For example, the reflection rays 320 may degrade a critical dimension (CD) uniformity of patterns to be formed on the wafer. FIG. 3 also illustrates a capping layer 230.

Referring to FIGS. 4 and 5, the second sidewalls 420L of the trenches 400 may have negative sloped profiles. In such a case, all of incident EUV rays 330 irradiated onto the border region 130 during an exposure process may directly pass through the substrate 210 (see FIG. 2) without any irradiation onto the reflection layer 220. Specifically, in the event that the incident EUV rays 330 are irradiated onto the border region 130 at an incident angle of about 6 degrees toward a left side as illustrated in FIG. 4 and the second sidewall 420L of the trenches 400 has a negative profile which is substantially parallel with the incident EUV rays 330, all the incident EUV rays 330 may directly pass through the substrate 210 without any irradiation onto the reflection layer 220. Thus, the reflectivity of the incident EUV rays 330 may be substantially zero.

Similarly, in the event that incident EUV rays 340 are irradiated onto the border region 130 at an incident angle of about 6 degrees toward a right side as illustrated in FIG. 5 and the first sidewall 410L of the trenches 400 has a negative profile which is parallel with the incident EUV rays 340, all the incident EUV rays 340 may directly pass through the substrate 210 without any irradiation onto the reflection layer 220. Thus, the reflectivity of the incident EUV rays 340 may also be substantially zero. Thus, according to the embodiments, all the incident EUV rays introduced into the trench 400 may pass through the substrate 210 without generation of any reflection lights because of the presence of the negative sloped sidewalls 410L and 420L the trench 400. Accordingly, it may be possible to form patterns having a uniform CD on the wafer without any pattern defects. This reflection suppress mechanism of the incident EUV rays introduced into the trench 400 defined by the sidewalls 410L and 420L may be equally applicable to the case that the incident EUV rays are introduced into the trench 400 defined by the sidewalls 410R and 420R.

Figure 6:
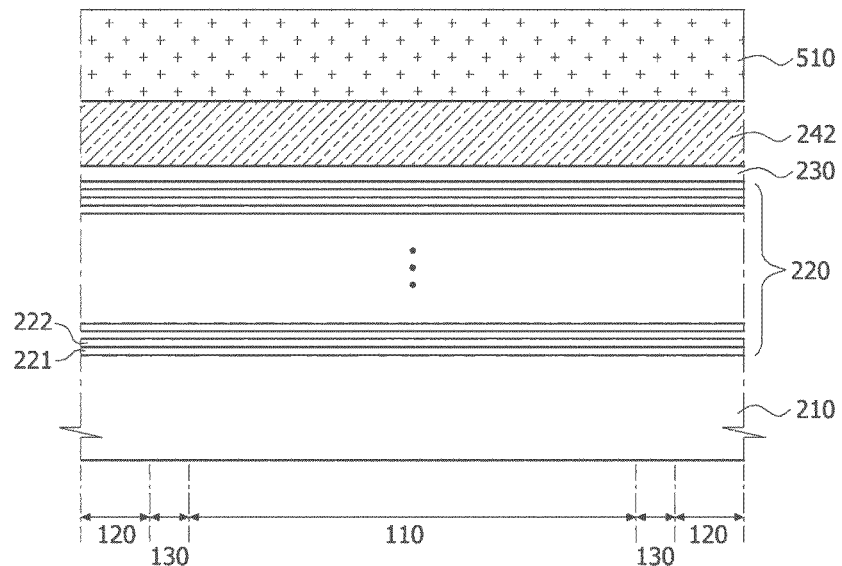

FIGS. 6 to 10 are cross sectional views illustrating a method of fabricating the reflection-type photomask (for example, see FIGS. 1 and 2) according to the various embodiments. Referring to FIG. 6, a reflection layer 220 may be formed on a front surface of a substrate 210 having a pattern transfer region 110 and a light blocking region 120. As described with reference to FIG. 1, the light blocking region 120 may be disposed to surround the pattern transfer region 110 and a border region 130 may be disposed between the pattern transfer region 110 and the light blocking region 120. The substrate 210 may be a transparent substrate having a low thermal expansion coefficient. In various embodiments, the substrate 210 may be formed of a material having a thermal expansion coefficient that corresponds to a pattern disposition error rate of about 0.05 ppm/° C. within a temperature range of 0° C. to 50° C. Further, the substrate 210 may be formed to have a front surface flatness of about 50 nanometers or less and a backside surface flatness of about 500 nanometers or less.

The reflection layer 220 may be formed to have a multi-layered structure. For example, the reflection layer 220 may be formed by alternately and repeatedly stacking a first reflection layer 221 and a second reflection layer 222 that have different diffraction coefficients from each other. In various embodiments, one of the first and second reflection layers 221 and 222 may be formed of a molybdenum (Mo) layer and the other layer may be formed of a silicon (Si) layer. In such a case, the reflection layer 220 may be formed such that an uppermost layer of the reflection layer 220 becomes a molybdenum (Mo) layer. In various embodiments, the molybdenum (Mo) layer of the reflection layer 220 may be replaced with a ruthenium (Ru) layer. A thickness of the molybdenum (Mo) layer and a thickness of the silicon (Si) layer may be optimized to minimize the absorption of the EUV ray and to maximize the dispersion of the EUV ray. For example, the molybdenum (Mo) layer may be formed to have a thickness of about 2.8 nanometers and the silicon (Si) layer may be formed to have a thickness of about 4.1 nanometers. The number of the molybdenum (Mo)-silicon (Si) pair constituting the reflection layer 220 may be within the range of about 30 to about 60. In particular embodiments, the number of the molybdenum (Mo)-silicon (Si) pair constituting the reflection layer 220 may be within the range of about 40 to about 60. In various embodiments, the reflection layer 220 may be formed using a magnetron sputtering process or an ion beam sputtering process. In such a case, the reflection layer 220 may be formed at a deposition temperature of about 150° C. or lower to obtain excellent hetero-junctions between the first and second reflection layers 221 and 222.

A capping layer 230 may be formed on a surface of the reflection layer 220 opposite to the substrate 210. The capping layer 230 may be formed to protect the reflection layer 220. In various embodiments, a process for forming the capping layer 230 may be omitted. The capping layer 230 may be thinly formed of a material having a relatively low EUV ray absorptiveness. For example, the capping layer 230 may be formed of a silicon (Si) layer or a ruthenium (Ru) layer and may be formed to a thickness of about 1 nanometer to about 2.5 nanometers in order to obtain both a protecting property and a relatively low EUV ray absorptiveness. An absorption layer 242 may be formed on a surface of the capping layer 230 opposite to the reflection layer 220. The absorption layer 242 may be formed of a metal layer having a property that absorbs the EUV ray when an exposure process is performed using the reflection-type photomask 100.

Although not shown in the drawings, a buffer layer may be additionally formed between the absorption layer 242 and the capping layer 230, and an anti-reflective coating (ARC) layer may be additionally formed on a surface of the absorption layer 242 opposite to the capping layer 230. The absorption layer 242 may be formed of a material having a relatively high EUV ray absorptiveness. For example, the absorption layer 242 may be formed of an aluminum copper (AlCu) layer, a titanium (Ti) layer, a titanium nitride (TiN) layer, a tantalum (Ta) layer, a tantalum nitride (TaN) layer or a chrome (Cr) layer. When the absorption layer 242 is formed of a tantalum nitride (TaN) layer or a chrome (Cr) layer, the absorption layer 242 may be formed to a thickness of about 70 nanometers or greater to obtain an EUV ray reflectivity of about 1% or less.

A first resist layer 510 may be formed on a surface of the absorption layer 242 opposite to the capping layer 230. The first resist layer 510 may be formed of a general photoresist layer, but not limited thereto. The substrate 210, the reflection layer 220, the capping layer 230, the absorption layer 242 and the first resist layer 510 may constitute a blank mask for an EUV lithography.

Figure 7:
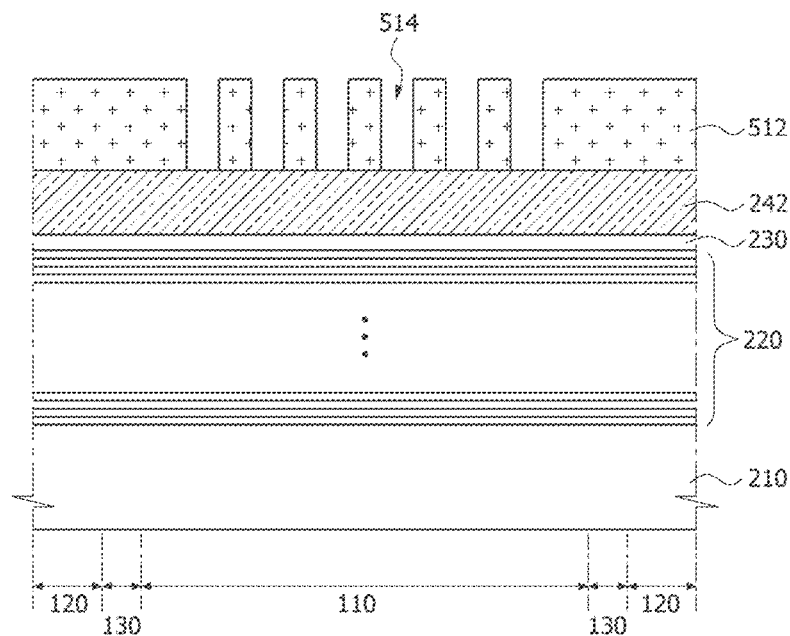

Referring to FIG. 7, the first resist layer 510 may be patterned using an exposure process and a development process, thereby forming a first resist pattern 512. The first resist pattern 512 may be formed to have openings 514 that expose portions of the absorption layer 242 in the pattern transfer region 110. The exposure process for forming the first resist pattern 512 may be performed using an electron beam lithography process, but not limited thereto. For example, the exposure process for forming the first resist pattern 512 may be performed using a general photolithography process. In any case, while the exposure process and the development process are performed, the first resist layer 510 may be baked at a temperature of about 150° C. or lower to prevent the reflection layer 220 from being thermally unstable.

Figure 8:
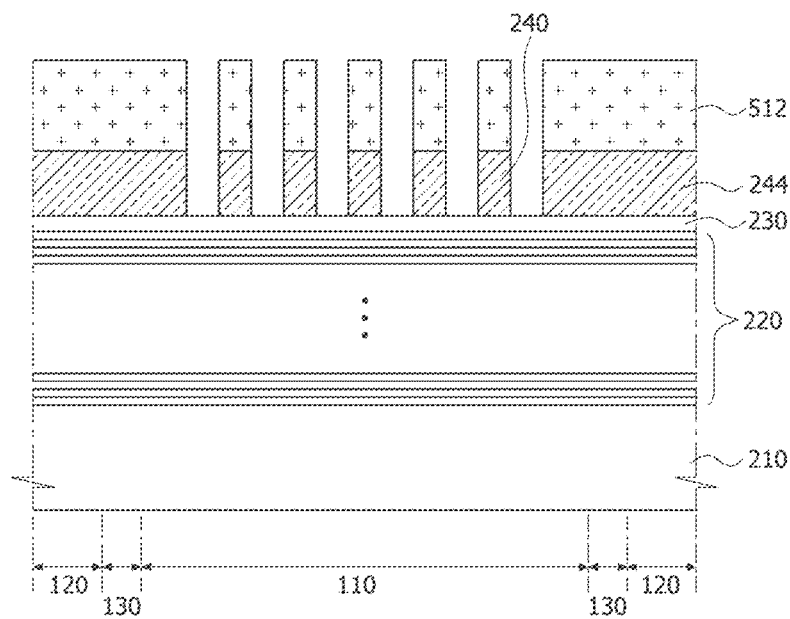

Referring to FIG. 8, the absorption layer 242 may be etched using the first resist pattern 512 as an etch mask, thereby forming first absorption layer patterns 240 whose images are transferred onto a wafer and an absorption layer pattern 244. The first absorption layer patterns 240 may be formed in a central portion of the pattern transfer region 110, and the absorption layer pattern 244 may be formed to cover the reflection layer 220 located in edges of the pattern transfer region 110, the reflection layer 220 located in the border region 130, and the reflection layer 220 located in the light blocking region 120. The absorption layer 242 may be etched using a dry etch process to accurately control critical dimensions (CDs) of the absorption layer patterns 240 and 244. In such a case, an etch recipe of the dry etch process for forming the absorption layer patterns 240 and 244 may be determined according to the material of the absorption layer 242. In various embodiments, when the absorption layer 242 is formed of a chrome (Cr) layer and the buffer layer under the absorption layer 242 and the anti-reflective coating (ARC) layer on the absorption layer 242 are formed of a silicon oxide ($SiO_2$) layer and a chrome oxynitride ($CrO_xN_y$) layer respectively, the anti-reflective coating (ARC) layer, the absorption layer 242 and the buffer layer may be etched using a dry etch process that employs a mixture of a chlorine ($Cl_2$) gas and an oxygen ($O_2$) gas as a dry etching gas. Alternatively, when the absorption layer 242 is formed of a tantalum nitride (TaN) layer, a chlorine ($Cl_2$) gas may be used as a dry etching gas.

After the first absorption layer patterns 240 are formed in the pattern transfer region 110, the first resist pattern 512 may be removed.

Referring to FIG. 9, a second resist pattern 522 may be formed on the substrate where the first resist pattern 512 is removed. The second resist pattern 522 may be formed using substantially the same process as used in formation of the first resist pattern 512. The second resist pattern 522 may be formed to have an opening 524 that exposes a portion of the absorption layer pattern 244, which is located in the border region 130.

Referring to FIG. 10, the absorption layer pattern 244 may be etched using the second resist pattern 522 as an etch mask to expose the capping layer 230 in the border region 130. As a result, a second absorption layer pattern 240a may be formed in the light blocking region 120. Subsequently, the capping layer 230 and the reflection layer 220 in the border region 130 may be selectively etched using the second resist pattern 522 as an etch mask, thereby forming a trench 400 that exposes the substrate 210. The trench 400 may be formed to include sidewalls having a negative sloped profile. After the trench 400 is formed, the second resist pattern 522 may be removed.

Figure 11:
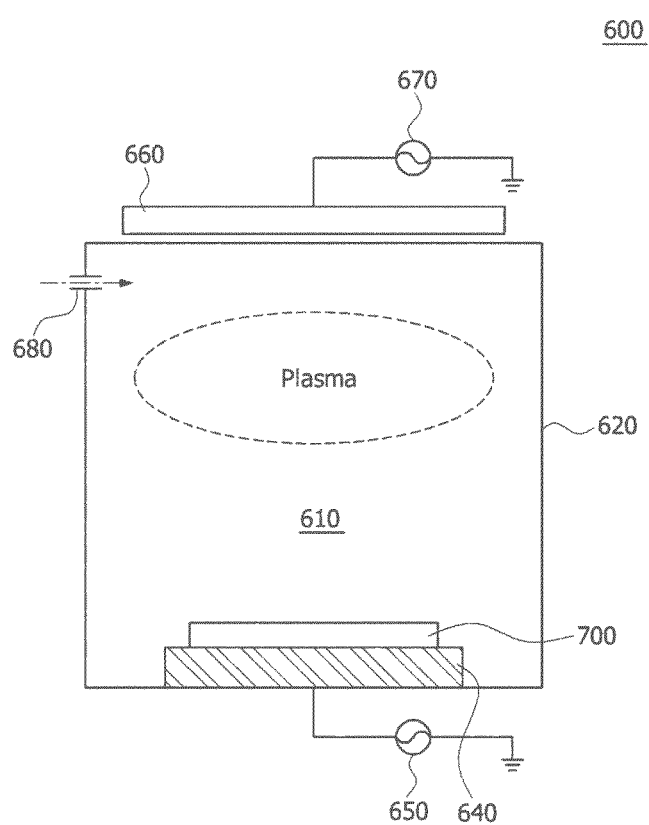
FIG. 11 is a schematic view illustrating a plasma apparatus used in formation of a trench of a reflection-type photomask according to various embodiments.
Figure 12:
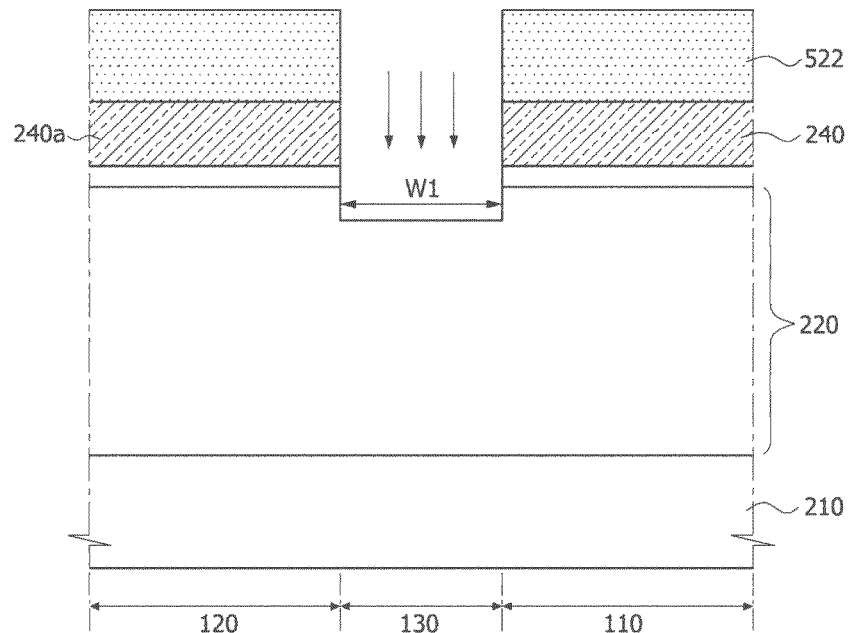
FIGS. 12, 13 and 14 are cross sectional views illustrating process steps to form a trench of a reflection-type photomask according to various embodiments using the plasma apparatus shown in FIG. 11.
Figure 13:
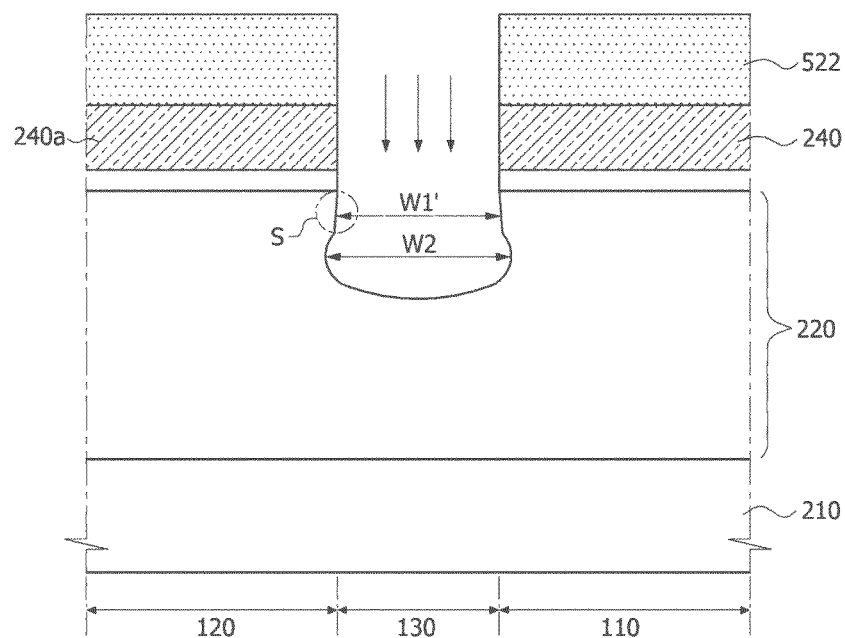
Figure 14:
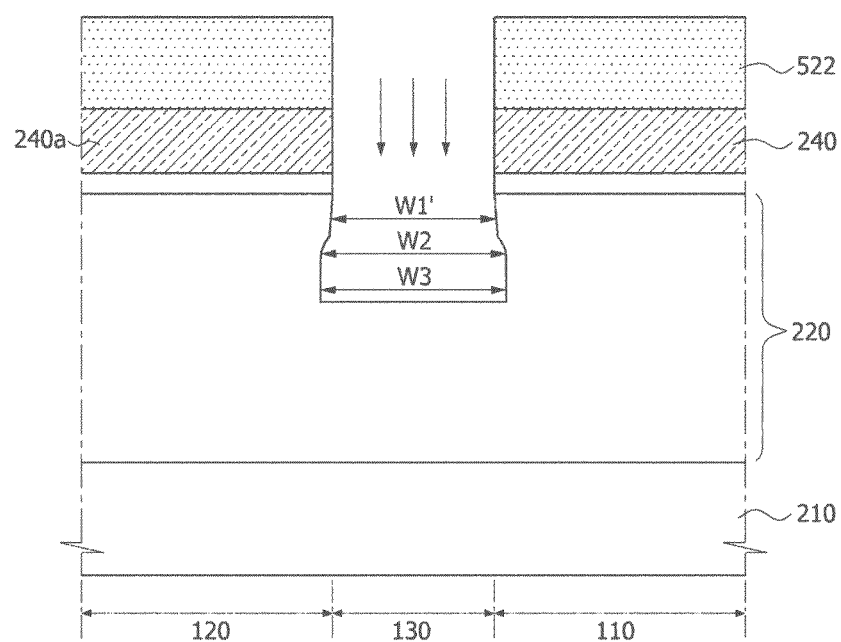

FIG. 11 is a schematic view illustrating a plasma apparatus used in formation of the trench of the reflection-type photomask according to various embodiments, and FIGS. 12, 13 and 14 are cross sectional views illustrating process steps to form the trench of the reflection-type photomask according to various embodiments using the plasma apparatus shown in FIG. 11.

Referring to FIG. 11, a plasma apparatus 600 may include a chamber 620 providing a reaction space 610 in which plasma is generated. A susceptor 640 may be disposed in the chamber 620. The susceptor 640 may support a plasma process target object, for example, a photomask 700 in which a trench is formed in a subsequent process. The susceptor 640 may be electrically connected to a first power supply 650 generating a bias power. A plasma source 660 may be disposed over the chamber 620, and the plasma source 660 may be electrically connected to a second power supply 670 generating a source power. The plasma source 660 may be an inductively coupled plasma (ICP) source or a capacitively coupled plasma (CCP) source. A gas inlet 680 may be disposed to pass through a wall of the chamber 620. A reaction gas may be introduced into the chamber 620 through the gas inlet 680.

The photomask 700 including the second resist pattern 522 and the absorption layer patterns 240 and 240a may be loaded on the susceptor 640 of the plasma apparatus 600. A reaction gas may then be supplied into the reaction space 610 of the plasma apparatus 600, and a source power generated from the second power supply 670 may be applied to the plasma source 660. As a result, plasma may be generated in the chamber 620. Subsequently, a bias power generated from the first power supply 650 may be applied to the susceptor 640 to etch the reflection layer (220 of FIG. 10) and to form the trench (400 of FIG. 10). In such a case, the trench 400 may be formed to include sidewalls having a negative sloped profile, as described above. That is, the trench 400 may be formed such that a width of the trench 400 gradually increases toward the substrate (210 of FIG. 10).

In order that the trench 400 is formed to have negative sloped sidewalls, the reflection layer 220 may be etched using an appropriate etch gas that maximizes a difference between etch rates of the first and second reflection layers constituting the reflection layer 220. In various embodiments, the reflection layer 220 may be formed by alternately and repeatedly stacking a molybdenum (Mo) layer and a silicon (Si) layer. In such a case, if the reflection layer 220 is etched using a chlorine (Cl$_2$) gas that exhibits a relatively low etch rate to the molybdenum (Mo) layer and a relatively high etch rate to the silicon (Si) layer, the sidewalls of the trench 400 may be formed to have negative sloped profiles due to a difference between etch rates of the molybdenum (Mo) layer and the silicon (Si) layer. That is, when an uppermost molybdenum (Mo) layer is etched, a width of the trench 400 surrounded by the etched uppermost molybdenum (Mo) layer may be narrow due to a relatively low etch rate of the molybdenum (Mo) layer. However, when an uppermost silicon (Si) layer under the etched uppermost molybdenum (Mo) layer is etched, a width of the trench 400 surrounded by the etched uppermost silicon (Si) layer may become widened due to a relatively high etch rate of the silicon (Si) layer. Thus, sidewalls of the trench 400 defined by the etched uppermost molybdenum (Mo) layer and the etched uppermost silicon (Si) layer may be formed to exhibit a negative profile. Further, when a second uppermost molybdenum (Mo) layer under the etched uppermost silicon (Si) layer is etched, the trench 400 surrounded by the etched second uppermost molybdenum (Mo) layer may be formed to have substantially the same width as the trench in the etched uppermost silicon (Si) layer even though the second uppermost molybdenum (Mo) layer exhibits a relatively low etch rate. That is, the width of the trench in the second uppermost molybdenum (Mo) layer may be greater than that of the trench in the uppermost molybdenum (Mo) layer. Accordingly, if the above processes are repeatedly performed, sidewalls of the final trench 400 may be formed to have a negative profile.

The negative sloped sidewalls of the trench 400 may be formed by accurately controlling the supply of the etching gas and the bias power. Specifically, the trench 400 having the negative sloped sidewalls may be formed by alternately and repeatedly applying a first etch process that a physical etch step is dominantly carried out and a second etch process that a chemical etch step is dominantly carried out to the reflection layer 220 in the plasma apparatus 600 shown in FIG. 11. In such a case, while the reflection layer 220 is etched, an argon (Ar) gas and a chlorine (Cl$_2$) gas may be used as etch reaction gases and the bias power may be varied to control etch characteristics.

In more detail, as illustrated in FIG. 12 (see also FIGS. 1 and 2), when an uppermost portion of the reflection layer 220 is etched, a flow rate of a chlorine (Cl$_2$) gas introduced into the chamber (620 of FIG. 11) may be reduced and a flow rate of an argon (Ar) gas introduced into the chamber (620 of FIG. 11) may be increased. As a result, a physical etch process rather than a chemical etch process may be dominantly performed such that the uppermost portion of the reflection layer 220 is anisotropically etched by the argon (Ar) gas, as indicated by the vertical arrows of FIG. 12. Thus, a width W1 of a preliminary trench formed in the uppermost portion of the reflection layer 220 may be substantially equal to a width of an opening in the second resist pattern 522, and sidewalls of the preliminary trench may be formed to have a vertical profile. Subsequently, as illustrated in FIG. 13, when the reflection layer 220 is etched, a flow rate of the chlorine (Cl$_2$) gas introduced into the chamber (620 of FIG. 11) may be increased and a flow rate of the argon (Ar) gas introduced into the chamber (620 of FIG. 11) may be reduced. As a result, a chemical etch process rather than a physical etch process may be dominantly performed. Thus, the reflection layer 220 may be isotropically etched by the chlorine (Cl$_2$) gas. Accordingly, a lower portion of the preliminary trench may be enlarged to have a width W2 which is greater than the width W1. Further, while the reflection layer 220 is isotropically etched by the chlorine (Cl$_2$) gas, a width W1' of the trench S having the vertical sidewalls may be gradually increased toward the substrate 210. Subsequently, as illustrated in FIG. 14, when the reflection layer 220 is etched, a flow rate of the chlorine (Cl$_2$) gas introduced into the chamber (620 of FIG. 11) may be reduced and a flow rate of the argon (Ar) gas introduced into the chamber (620 of FIG. 11) may be increased. As a result, a physical etch process rather than a chemical etch process may be dominantly performed. Thus, the reflection layer 220 may be anisotropically etched by the argon (Ar) gas. Accordingly, a lower portion of the trench may be increased to have a width W3 which is substantially equal to the width W2.

As described above, the physical etch process (e.g., a first etch process) exhibiting an anisotropic etch property and the chemical etch process (e.g., a second etch process) exhibiting an isotropic etch property may be alternatively and repeatedly applied to the reflection layer 220 to form the trench 400 having the negative sloped sidewalls. Even though the physical etch process forms the vertical sidewalls of the trench, the vertical sidewalls may be deformed to have a negative profile while the chemical etch process and the physical process are alternately and repeatedly performed. Thus, the entire sidewalls of the final trench may be formed to have a negative profile.

In other embodiments, a slope of the sidewalls of the trench may be controlled by adjusting the amount of the etching gases supplied into the chamber (620 of FIG. 11). For example, if an etch gas dominantly affecting the physical etch process is more supplied, the sidewalls of the trench may be formed to have a steep slope. In contrast, if an etch gas dominantly affecting the chemical etch process is more supplied, the sidewalls of the trench may be formed to have an easy slope or gradual slope. Alternatively, a slope of the sidewalls of the trench may be controlled by adjusting a bias power which is applied to the susceptor (640 of FIG. 11). For example, if the bias power increases, the physical etch process (e.g., an anisotropic etch process) may be dominantly performed to make the sidewalls of the trench steeper. In contrast, if the bias power decreases, the chemical etch process (e.g., an isotropic etch process) may be dominantly performed to make the sidewalls of the trench easier or more gradual.

According to the embodiments set forth above, sidewalls of a trench formed in a border region between a pattern transfer region and a light blocking region may have a negative sloped profile. That is, a width of the trench may be gradually increased toward a substrate. Thus, when incident EUV rays are irradiated onto the substrate at a non-zero incident angle during an EUV exposure process, a reflectivity of the incident EUV rays introduced into the trench of the border region may be minimized to prevent generation of undesired reflection rays that travel toward a neighbor shot filed adjacent to a target shot field on a wafer. Accordingly, a critical dimension (CD) uniformity of patterns formed on the wafer may be improved without any pattern defects.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:
1. A reflection-type photomask comprising:
  a substrate including a pattern transfer region, a light blocking region and a border region;
  a reflection layer on a front surface of the substrate;

a trench penetrating the reflection layer in the border region to expose the substrate;

first absorption layer patterns on the reflection layer in the pattern transfer region; and a second absorption layer pattern on the reflection layer in the light blocking region, wherein sidewalls of the trench have a sloped profile.

2. The reflection-type photomask of claim 1, wherein the substrate is a low thermal expansion material (LTEM) substrate.

3. The reflection-type photomask of claim 1, wherein the reflection layer has a multi-layered structure including a first reflection layer and a second reflection layer which are alternately and repeatedly stacked, and the first reflection layer and the second reflection layer have different diffraction coefficients from each other.

4. The reflection-type photomask of claim 3, wherein one of the first and second reflection layers is a molybdenum (Mo) layer and the other is a silicon (Si) layer.

5. The reflection-type photomask of claim 4, wherein an uppermost layer of the reflection layer having the multi-layered structure is a molybdenum (Mo) layer.

6. The reflection-type photomask of claim 1, further comprising a capping layer between the reflection layer and the first and second absorption layer patterns.

7. The reflection-type photomask of claim 1, wherein each of the first and second absorption layer patterns includes an aluminum copper (AlCu) layer, a titanium (Ti) layer, a titanium nitride (TiN) layer, a tantalum (Ta) layer, a tantalum nitride (TaN) layer or a chrome (Cr) layer.

8. The reflection-type photomask of claim 1, wherein the pattern transfer region is surrounded by the light blocking region, and the border region is disposed between the pattern transfer region and the light blocking region.

9. The reflection-type photomask of claim 1, wherein the sidewalls of the trench have a slope which is parallel with incident EUV rays irradiated onto the substrate during an exposure process.

10. The reflection-type photomask of claim 1, wherein the sidewalls of the trench have a negative profile such that a width of the trench is gradually increased toward the substrate.

11. A reflection-type photomask comprising:

a substrate including a pattern transfer region having image patterns corresponding to patterns which are formed on a wafer, a light blocking region surrounding the pattern transfer region, and a border region between the pattern transfer region and the light blocking region;

a reflection layer on a front surface of the substrate;

a trench penetrating the reflection layer in the border region to separate the reflection layer into two portions; and absorption layer patterns on the reflection layer, wherein at least one of both sidewalls of the trench has a sloped profile.

12. A method of fabricating a reflection-type photomask, the method comprising:

forming a reflection layer and an absorption layer on a substrate including a pattern transfer region having image patterns corresponding to patterns which are formed on a wafer, a light blocking region surrounding the pattern transfer region, and a border region between the pattern transfer region and the light blocking region;

removing portions of the absorption layer in the pattern transfer region to form absorption layer patterns; and removing the absorption layer and the reflection layer in the border region to form a trench exposing the substrate in the border region, wherein at least one of both sidewalls of the reflection layer exposed by the trench is formed to have a negative sloped profile.

13. The method of claim 12, wherein the substrate is formed of a low thermal expansion material (LTEM).

14. The method of claim 12, wherein the reflection layer is formed by alternately and repeatedly stacking a first reflection layer and a second reflection layer that have different diffraction coefficients from each other.

15. The method of claim 14, wherein one of the first and second reflection layers is formed of a molybdenum (Mo) layer and the other is formed of a silicon (Si) layer.

16. The method of claim 12, further comprising forming a capping layer on the reflection layer prior to formation of the absorption layer.

17. The method of claim 12, wherein the absorption layer is formed of an aluminum copper (AlCu) layer, a titanium (Ti) layer, a titanium nitride (TiN) layer, a tantalum (Ta) layer, a tantalum nitride (TaN) layer or a chrome (Cr) layer.

18. The method of claim 12, wherein the sidewalls of the trench are formed to be parallel with incident EUV rays irradiated onto the substrate during an exposure process.

19. The method of claim 12, wherein the trench is formed by etching the absorption layer and the reflection layer using a dry etch process that employs a chlorine (Cl2) gas as an etch gas.

20. The method of claim 12, wherein the absorption layer patterns are formed by dry-etching the absorption layer using a first resist pattern as an etch mask, and the trench is formed by dry-etching the absorption layer and the reflection layer using a second resist pattern as an etch mask.

21. The method of claim 12, wherein the trench is formed using a plasma etching apparatus.

22. The method of claim 21:

wherein the trench is formed by alternately and repeatedly applying a first etch process and a second etch process to the reflection layer; and wherein the first etch process is an etch process that a physical etch step is dominantly carried out and the second etch process is an etch process that a chemical etch step is dominantly carried out.

23. The method of claim 22, wherein the first etch process is performed using an argon gas as an main etch gas and the second etch process is performed using a chlorine gas as an main etch gas.

24. The method of claim 21:

wherein the trench is formed by alternately and repeatedly applying a first etch process and a second etch process to the reflection layer; and wherein the first etch process is performed with a relatively high bias power and the second etch process is performed with a relatively low bias power.

* * * * *